(12) United States Patent
Suganaga

(10) Patent No.: US 10,418,327 B2
(45) Date of Patent: Sep. 17, 2019

(54) SEMICONDUCTOR DEVICE

(71) Applicant: Renesas Electronics Corporation, Koutou-ku, Tokyo (JP)

(72) Inventor: Toshifumi Suganaga, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/840,257

(22) Filed: Dec. 13, 2017

(65) Prior Publication Data
US 2018/0233402 A1  Aug. 16, 2018

(30) Foreign Application Priority Data
Feb. 10, 2017 (JP) ................. 2017-023321

(51) Int. Cl.
| | |
|---|---|
| H01L 23/535 | (2006.01) |
| H01L 23/522 | (2006.01) |
| H01L 21/768 | (2006.01) |
| H01L 23/528 | (2006.01) |
| H01L 23/532 | (2006.01) |

(52) U.S. Cl.
CPC ...... *H01L 23/535* (2013.01); *H01L 21/76804* (2013.01); *H01L 21/76816* (2013.01); *H01L 21/76829* (2013.01); *H01L 21/76877* (2013.01); *H01L 23/5226* (2013.01); *H01L 23/5283* (2013.01); *H01L 23/53228* (2013.01); *H01L 23/53257* (2013.01); *H01L 2224/05* (2013.01)

(58) Field of Classification Search
None
See application file for complete search history.

(56) References Cited

U.S. PATENT DOCUMENTS 4,172,004 A * 10/1979 Alcorn .............. H01L 21/32134
                                                    204/192.32
5,420,078 A *  5/1995 Sikora ............... H01L 21/76804
                                                    257/E21.578
(Continued)

FOREIGN PATENT DOCUMENTS

| EP | 0 845 808 A2 | 6/1998 |
|---|---|---|
| JP | 2002-343861 A | 11/2002 |
| JP | 2008-205032 A | 9/2008 |

OTHER PUBLICATIONS

Extended European Search Report dated Jun. 26, 2018, in European Patent Application No. 17206886.8.

*Primary Examiner* — Anthony Ho
*Assistant Examiner* — Kevin Quinto
(74) *Attorney, Agent, or Firm* — Shapiro, Gabor and Rosenberger, PLLC

(57) ABSTRACT

An object of the present invention is to improve the operating characteristics of a semiconductor device.
A semiconductor device has a contact plug that is formed over a semiconductor substrate, a metal wiring that is coupled to the upper surface of the contact plug, and a slit that is formed in the metal wiring. Further, the contact plug is formed at an end of the metal wiring, and the slit is formed at a position apart from the contact plug in an X direction in a planar view. A distance between an edge of the upper surface at the end of the metal wiring and the upper surface of the slit in the X direction is equal to or larger than and twice or smaller than a first plug diameter of the upper surface of the contact plug in the X direction.

16 Claims, 5 Drawing Sheets

(56) References Cited

U.S. PATENT DOCUMENTS

| | | | |
|---|---|---|---|
| 5,451,819 A * | 9/1995 | Koyama | H01L 23/485 257/758 |
| 5,804,513 A * | 9/1998 | Sakatani | C04B 35/1115 106/3 |
| 6,166,442 A | 12/2000 | Nakamura | |
| 2002/0173096 A1 | 11/2002 | Okudaira | |
| 2005/0055654 A1 | 3/2005 | Lin et al. | |
| 2013/0075931 A1* | 3/2013 | Su | H01L 24/05 257/774 |
| 2015/0228586 A1 | 8/2015 | Usami et al. | |

* cited by examiner

SEMICONDUCTOR DEVICE

CROSS-REFERENCE TO RELATED APPLICATIONS

The disclosure of Japanese Patent Application No. 2017-023321 filed on Feb. 10, 2017 including the specification, drawings and abstract is incorporated herein by reference in its entirety.

BACKGROUND

The present invention relates to a semiconductor device, and can be preferably used for a semiconductor device having a metal wiring formed by, for example, a damascene process.

Japanese Unexamined Patent Application Publication No. 2002-343861 describes a semiconductor integrated circuit in which the upper surface of a contact plug located at the end opposite to the lower surface thereof projects from the main surface of an interlayer insulating film and a capacitor lower electrode is arranged, while the center thereof is deviated, at an upper portion of the contact plug so as to cover a projection part of the contact plug.

SUMMARY

Along with the microfabrication of a large scale integration (LSI) circuit, it is difficult to secure the contact area between a metal wiring formed by a damascene process and a contact plug located at an end of the metal wiring, and the operating characteristics of the semiconductor device is disadvantageously deteriorated due to an increase in contact resistance.

The other problems and novel features will become apparent from the description of the specification and the accompanying drawings.

A semiconductor device according to one embodiment has a contact plug that is formed over a semiconductor substrate, a metal wiring that is coupled to the upper surface of the contact plug, and a slit that is formed in the metal wiring. Further, the contact plug is formed at an end of the metal wiring, and the slit is formed at a position apart from the contact plug in a first direction in a planar view. A distance between an edge of the upper surface at the end of the metal wiring and the upper surface of the slit in the first direction is equal to or larger than and twice or smaller than a first diameter of the upper surface of the contact plug in the first direction.

According to one embodiment, it is possible to improve the operating characteristics of a semiconductor device.

DETAILED DESCRIPTION

Figure 1:
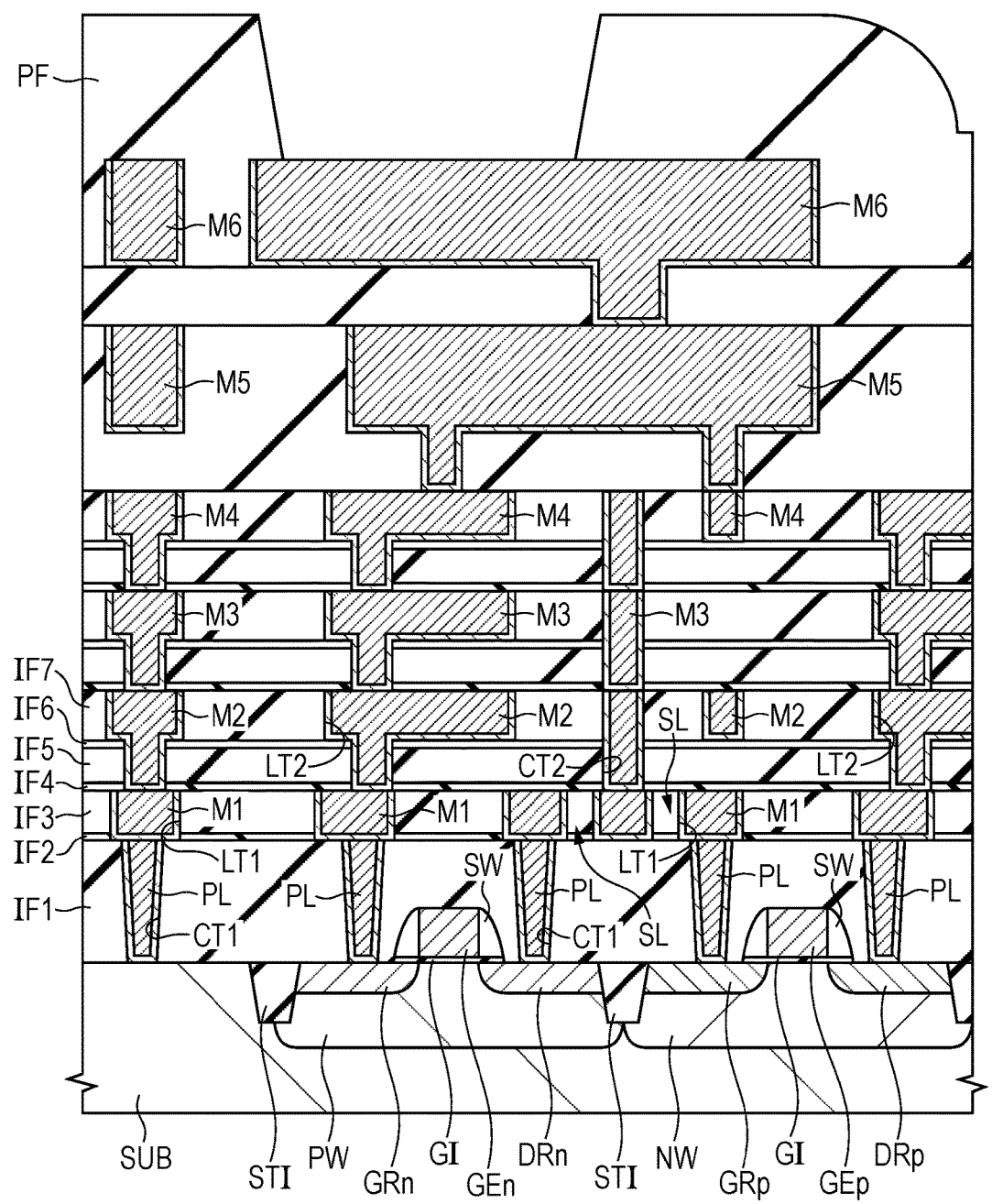
FIG. 1 is a cross-sectional view of a semiconductor device according to an embodiment.

The present invention will be described using the following embodiment while being divided into a plurality of sections or embodiments if necessary for convenience sake. However, except for a case especially specified, the sections or embodiments are not irrelevant to each other, and one has a relationship as a part or all of a modified example, an application, a detailed explanation, or a supplementary explanation of the other. Further, when the specification refers to the number of elements (including the number of pieces, values, amounts, ranges, and the like) in the following embodiment, the number is not limited to the specific number, but may be smaller or larger than the specific number, except for a case especially specified or a case obviously limited to the specific number in principle.

Furthermore, the constitutional elements (including elemental steps and the like) are not necessarily essential in the following embodiment except for a case especially specified or a case obviously deemed to be essential in principle. Likewise, when the specification refers to the shapes or positional relationships of the constitutional elements in the following embodiment, the present invention includes the constitutional elements that are substantially close or similar in shapes and the like, except for a case especially specified or a case obviously deemed not to be close or similar in principle. The same applies to the number and the like (including the number of pieces, values, amounts, ranges, and the like).

Hereinafter, the embodiment will be described in detail on the basis of the drawings. It should be noted that members having the same functions are followed by the same or relevant signs in all the drawings for explaining the embodiment, and the repeated explanation thereof will be omitted. Further, in the case where a plurality of similar members (parts) exits, symbols are added to general signs to show individual or specific parts in some cases. Further, the explanation of the same or similar portions will not be repeated in principle in the following embodiment except for a case where the explanation is necessary.

Further, hatchings will be omitted in some cases even in the case of a cross-sectional view in order to easily view the drawing used in the embodiment. Further, hatchings will be added in some cases even in the case of a plan view in order to easily view the drawing.

Further, the size of each part is not associated with an actual device in a cross-sectional view and a plan view, and a specific part is relatively enlarged in some cases in order to easily understand the drawings. Further, even in the case where a cross-sectional view is associated with a plan view, a specific part is relatively enlarged in some cases in order to easily understand the drawings.

Further, when referring to silicon nitride in the following embodiment, not only $Si_3N_4$ but also a similar composition (for example, a composition deviating from a stoichiometric composition) of silicon nitride is included. Further, when referring to silicon oxide, not only $SiO_2$ but also a similar composition (for example, a composition deviating from a stoichiometric composition) of silicon oxide is included. Other materials similarly include similar compositions (for example, compositions deviating from stoichiometric compositions). Further, in the following embodiment, silicon nitride is described as "SiN" and silicon oxide is described as "$SiO_2$". Other materials are similarly described using chemical symbols. For example, copper is occasionally described as "Cu", tungsten as "W", silicon as "Si", titanium as "Ti", tantalum as "Ta", titanium nitride as "TiN", and tantalum nitride as "TaN".

Further, in the following embodiment, an X direction, a Y direction, and a Z direction are used as directions for explanation. The X direction is the wiring width direction of a metal wiring, and the Y direction is the wiring length direction of the metal wiring. The X direction and the Y direction are orthogonal to each other, and are directions configuring a horizontal plane. The Z direction is a direction vertical to the horizontal plane.

(Details of Problem)

Figure 5A:
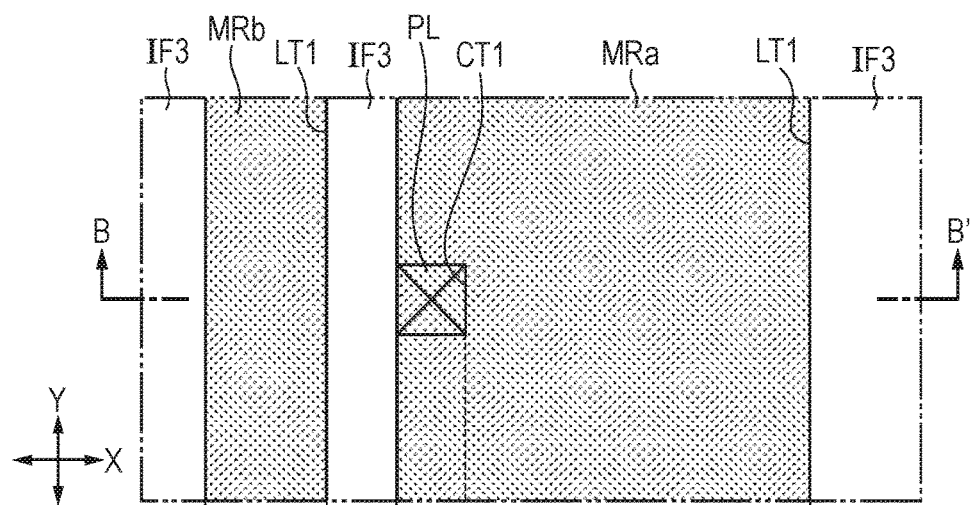
FIG. 5A is a plan view for showing designed metal wirings and a designed contact plug according to a comparative example.
Figure 5B:
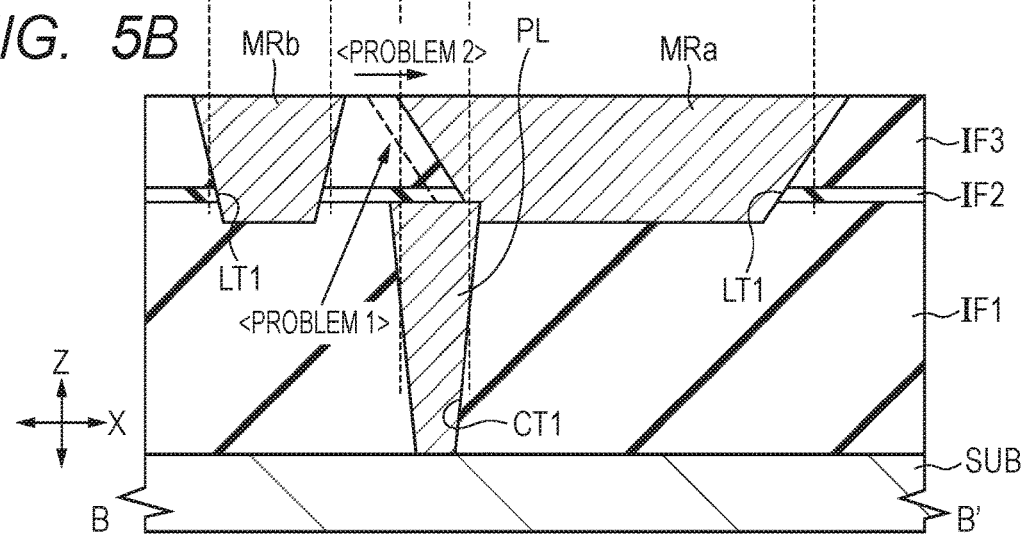
FIG. 5B is a cross-sectional view for showing finished metal wirings and a finished contact plug according to the comparative example.

Since the characteristics and effects of the metal wirings according to the embodiment are considered to be clearer, room for improvement of the metal wirings formed by a damascene process and found by the inventors will be described first using FIGS. 5A and 5B. FIG. 5A is a plan view for showing designed metal wirings and a designed contact plug according to a comparative example. FIG. 5B is a cross-sectional view for showing the finished metal wirings and the finished contact plug according to the comparative example, and corresponds to a cross-sectional view taken along the line B-B' of FIG. 5A.

Metal wirings MRa and MRb described using FIGS. 5A and 5B are wirings that are formed by a single damascene method and are electrically coupled to a contact plug (also referred to as a plug, a plug electrode, an embedded plug, or the like) PL located in the lower layer. For example, the metal wirings MRa and MRb correspond to a first-layer wiring M1 in the semiconductor device shown in FIG. 1 to be described later.

Meanwhile, when the metal wirings MRa and MRb and the contact plug PL are actually formed, the designed shapes and the finished shapes may be different from each other. For example, the designed shape of the contact plug PL in a planar view is a quadrangle. However, when the contact plug PL is actually formed, the finished shape of the contact plug PL in a planar view becomes a circular shape because the corners of a connection hole CT1 into which the contact plug PL is embedded are rounded due to the rounding phenomenon. Further, for example, it is difficult to vertically process a wiring groove LT1 into which the metal wirings MRa and MRb are embedded and the connection hole CT1 into which the contact plug PL is embedded. When the wiring groove LT1 and the connection hole CT1 are actually formed, the side walls thereof are inclined.

Accordingly, FIG. 5A shows the designed metal wirings MRa and MRb and the designed contact plug PL in a planar view, and FIG. 5B shows the finished metal wirings MRa and MRb and the finished contact plug PL in a cross-sectional view.

It should be noted that the side positions of the designed metal wirings MRa and MRb in a planar view substantially coincide with the side intermediate positions of the finished metal wirings MRa and MRb in the Z direction (the direction vertical to the upper surfaces of the metal wirings MRa and MRb) in a cross-sectional view. Thus, the metal wirings MRa and MRb shown in FIG. 5A can be regarded as a view obtained by planarly cutting the metal wirings MRa and MRb shown in FIG. 5B at the intermediate positions in the Z direction. Likewise, the side position of the designed contact plug PL in a planar view substantially coincides with the side intermediate position of the finished contact plug PL in the Z direction (the direction vertical to the upper surface of the contact plug PL) in a cross-sectional view. Thus, the contact plug PL shown in FIG. 5A can be regarded as a view obtained by planarly cutting the contact plug PL shown in FIG. 5B at the intermediate position in the Z direction.

Further, each dimension means a designed dimension and a finished dimension. However, each dimension refers to a finished dimension, unless otherwise specified.

As shown in FIGS. 5A and 5B, an interlayer insulating film IF1 is formed so as to cover a semiconductor element (not shown) formed on the main surface of a semiconductor substrate SUB, and the contact plug PL electrically coupled to the semiconductor element and the like is formed while penetrating from the upper surface to the lower surface of the interlayer insulating film IF1. The contact plug PL is configured using a conductive film that is embedded inside the connection hole CT1 formed in the interlayer insulating film IF1 and is mainly made of, for example, W.

Further, a stopper insulating film IF2 and an insulating film IF3 on which wirings are formed are sequentially formed on the interlayer insulating film IF1. The stopper insulating film IF2 is a material having a function as a protective film for preventing diffusion of Cu. The insulating film IF3 is a material having a function of insulating and separating the metal wirings MRa and MRb.

The metal wirings MRa and MRb electrically coupled to the contact plug PL are formed by a damascene process while penetrating from the upper surface of the insulating film IF3 to the lower surface of the stopper insulating film IF2. The metal wirings MRa and MRb are configured using a conductive film that is embedded inside the wiring groove LT1 formed in the stopper insulating film IF2 and the insulating film IF3 and is mainly made of, for example, Cu.

However, the metal wirings MRa and MRb formed by the damascene process have room for improvement described below.

Namely, as the wiring widths of the metal wirings MRa and MRb increase, the finished taper angle of the side wall of the wiring groove LT1 along the wiring length direction (Y direction) where the metal wirings MRa and MRb are formed tend to increase. Further, as the separation part between the metal wiring MRa and the metal wiring MRb adjacent to each other in the wiring width direction (X direction) comes close to an isolated pattern, the lithography depth of focus decreases, and the finished dimension of the width of the separation part in the wiring width direction tends to be larger than the designed dimension.

Therefore, in the metal wiring MRa having a large wiring width and the separation part with a small width adjacent in the wiring width direction, the finished taper angle of the side surface along the wiring length direction increases (problem 1 shown in FIG. 5B), and the finished width of the separation part adjacent in the wiring width direction increases (problem 2 shown in FIG. 5B). In particular, when the designed wiring width of the metal wiring MRa is, for example, about 175 nm or larger and the designed width of the separation part adjacent to the metal wiring MRa in the wiring width direction is, for example, about 60 nm to 70 nm, the above-described problems 1 and 2 remarkably appear. It should be noted that only the metal wiring MRb having a small wiring width can be used in the semiconductor device. However, the parasitic resistance disadvantageously increases in this case. In order to reduce the parasitic resistance, the metal wiring MRa having a large wiring width is needed.

As described above, as the finished taper angle of the side wall along the wiring length direction of the metal wiring MRa increases and the finished width of the separation part adjacent to the metal wiring MRa in the wiring width direction increases, when the contact plug PL is formed at an end of the metal wiring MRa in the wiring width direction, the contact area between the metal wiring MRa and the contact plug PL is reduced to increase the contact resistance. According to the study conducted by the inventors, although the designed contact area between the upper surface of the contact plug PL and the metal wiring MRa was 100%, the finished contact area between the upper surface of the contact plug PL and the metal wiring MRa was only about 30% in some cases. Thus, there was a possibility of an open failure. Accordingly, the structure of the metal wiring MRa is devised to solve the above-described problems 1 and 2 in the embodiment, and the contact area between the metal wiring MRa and the contact plug PL is secured.

(Embodiment)

<Structure of Semiconductor Device>

An example of a structure of a semiconductor device according to the embodiment will be described using FIG. 1. FIG. 1 is a cross-sectional view of the semiconductor device according to the embodiment. Although various semiconductor elements such as a field effect transistor, a resistance element, and a capacitance element are fainted in the semiconductor device, a CMIS (Complementary Metal Insulator Semiconductor) device is exemplified in the embodiment. Hereinafter, an n-channel type MISFET (Metal Insulator Semiconductor Field Effect Transistor) configuring the CMIS device is abbreviated as nMIS, and a p-channel type MISFET is abbreviated as pMIS.

As shown in FIG. 1, the semiconductor device has a semiconductor substrate (a thin semiconductor plate in a substantially circular shape in a planar view referred to as a wafer) SUB made of monocrystalline silicon, and an active region is defined by element separation parts STI obtained by embedding an insulating film into a separation groove formed in the main surface thereof.

A p-type well PW is formed at a region (nMIS formation region) where the nMIS is formed in the semiconductor substrate SUB, and an n-type well NW is formed at a region (pMIS formation region) where the pMIS is formed in the semiconductor substrate SUB.

A gate insulating film GI is formed on the main surface (the surface of each of the p-type well PW and the n-type well NW) of the semiconductor substrate SUB, a gate electrode GEn of the nMIS is formed on the gate insulating film GI of the nMIS formation region, and a gate electrode GEp of the pMIS is formed on the gate insulating film GI of the pMIS formation region. The gate insulating film GI can be an $SiO_2$ film formed by, for example, a thermal oxidation method, and the gate electrodes GEn and GEp can be polycrystalline S1 films formed by, for example, a CVD (chemical vapor deposition) method. A silicide layer for reducing electric resistance may be formed on the surface of each polycrystalline S1 film. Further, the gate electrodes GEn and GEp are formed so as to extend from the active region onto the element separation parts STI.

A sidewall spacer SW is formed on each side wall of the gate electrode GEn of the nMIS and the gate electrode GEp of the pMIS. The sidewall spacer SW can be, for example, an $SiO_2$ film or an SiN film. Further, n-type semiconductor regions DRn functioning as the source/drain are formed in the p-type well PW on both sides of the gate electrode GEn of the nMIS across the channel region. Likewise, p-type semiconductor regions DRp functioning as the source/drain are formed in the n-type well NW on both sides of the gate electrode GEp of the pMIS across the channel region. Each of the source/drain of the nMIS and the source/drain of the pMIS may have a so-called LDD (lightly doped drain) structure.

The nMIS and the pMIS are covered with an interlayer insulating film IF1, and connection holes CT1 reaching the n-type semiconductor regions DRn, the p-type semiconductor regions DRp, the gate electrodes GEn and GEp, and the like are formed in the interlayer insulating film IF1. The interlayer insulating film IF1 can be, for example, an $SiO_2$ film, and the surface thereof is flattened by an etch-back method or a CMP (Chemical Mechanical Polishing) method.

A contact plug PL configured using a conductive film mainly made of, for example, W is formed inside each connection hole CT1. Specifically, a barrier metal film made of, for example, Ti, Ta, TiN, TaN, or the like is formed on the side surfaces and the bottom surface of each connection hole CT1, and the conductive film mainly made of W is embedded inside each connection hole CT1 through the barrier metal film. When referring to the contact plug PL in the embodiment, the barrier metal film and the conductive film are included.

On the interlayer insulating film IF1, a stopper insulating film IF2 and an insulating film IF3 on which wirings are formed are sequentially formed.

The stopper insulating film IF2 is a film that serves as an etching stopper when a grooving process is performed for the insulating film IF3, and a material having an etching selection ratio to the insulating film IF3 is used. Further, the stopper insulating film IF2 has a function as a protective film for preventing diffusion of Cu configuring a first-layer wiring M1. The stopper insulating film IF2 can be an SiN film formed by, for example, a plasma CVD method, and the insulating film IF3 can be an $SiO_2$ film formed by, for example, a plasma CVD method.

Wiring grooves LT1 are formed in the stopper insulating film IF2 and the insulating film IF3. The first-layer wirings M1 configured using conductive films mainly made of, for example, Cu are formed inside the wiring grooves LT1. Specifically, a barrier metal film made of, for example, Ti, Ta, TiN, TaN, or the like is formed on the side surfaces and the bottom surface of each wiring groove LT1, and the conductive film mainly made of Cu is embedded inside each wiring groove LT1 through the barrier metal film. When referring to the first-layer wiring M1 in the embodiment, the barrier metal film and the conductive film are included.

The first-layer wiring M1 is formed by a so-called single damascene method, and can be formed by, for example, the following manufacturing method. First, a barrier metal film is formed on the main surface of the semiconductor substrate SUB including the inside of the wiring groove LT1. Next, after forming a seed layer of Cu on the barrier metal film by a CVD method or a sputtering method, a Cu plating film is formed on the seed layer by using an electroplating method, and the inside of the wiring groove LT1 is embedded with the Cu plating film. Next, excesses of the Cu plating film, the seed layer, and the barrier metal film other than those inside the wiring groove LT1 are removed by a CMP method, and the Cu plating film, the seed layer, and the barrier metal film are left only inside the wiring groove LT1. Accordingly, the first-layer wiring M1 can be formed. It should be noted that the metal mainly made of Cu may be formed not only by an electroplating method but also a CVD method, a sputtering method, or a spatter reflow method.

In the semiconductor device according to the embodiment, a slit SL is formed in the first-layer wiring M1 having a designed wiring width of, for example, about 175 nm or larger, and the stopper insulating film IF2 and the insulating film IF3 are formed inside the slit SL, the details of which will be described later in <Characteristics and effects of metal wiring according to embodiment> (see FIGS. 2A and 2B).

A cap insulating film IF4, an interlayer insulating film IF5, a stopper insulating film IF6, and an insulating film IF7 in which the wiring groove is formed are sequentially formed on the first-layer wiring M1 and the insulating film IF3.

The cap insulating film IF4 is a film that serves as an etching stopper when a hole process is performed for the interlayer insulating film IF5, and a material having an etching selection ratio to the interlayer insulating film IF5 is used. Further, the cap insulating film IF4 has a function as a protective film for preventing diffusion of Cu configuring a second-layer wiring M2. The cap insulating film IF4 can be an SiN film formed by, for example, a plasma CVD method, and the interlayer insulating film IF5 can be a low-k film, for example, an SiON film formed by, for example, a plasma CVD method.

The stopper insulating film IF6 is a film that serves as an etching stopper when a groove process is performed for the insulating film IF7, and a material having an etching selection ratio to the interlayer insulating film IF5 and the insulating film IF7 is used. The stopper insulating film IF6 can be an SiN film formed by, for example, a plasma CVD method, and the insulating film IF7 can be a low-k film, for example, an SiON film formed by, for example, a plasma CVD method.

A connection hole CT2 is formed in the cap insulating film IF4, the interlayer insulating film IF5, and the stopper insulating film IF6, and wiring grooves LT2 are formed in the insulating film IF7. The second-layer wirings M2 configured using conductive films mainly made of, for example, Cu are formed inside the connection hole CT2 and the wiring grooves LT2. The connection member coupling the second-layer wirings M2 as upper-layer wirings to the first-layer wirings M1 as lower-layer wirings is formed integrally with the second-layer wirings M2. Specifically, a barrier metal film made of, for example, Ti, Ta, TiN, TaN, or the like is formed on the side surfaces and the bottom surface of each of the connection hole CT2 and the wiring grooves LT2, and the conductive film mainly made of Cu is embedded inside each of the connection hole CT2 and the wiring grooves LT2 through the barrier metal film. When referring to the second-layer wiring M2 in the embodiment, the barrier metal film and the conductive film are included.

The second-layer wiring M2 is formed by a so-called dual damascene method, and can be formed by, for example, the following manufacturing method. First, a barrier metal film is formed on the main surface of the semiconductor substrate SUB including the inside of each of the connection hole CT2 and the wiring groove LT2. Next, after forming a seed layer of Cu on the barrier metal film by a CVD method or a sputtering method, a Cu plating film is formed on the seed layer by using an electroplating method, and the inside of each of the connection hole CT2 and the wiring groove LT2 is embedded with the Cu plating film. Next, excesses of the Cu plating film, the seed layer, and the barrier metal film other than those inside the connection hole CT2 and the wiring groove LT2 are removed by a CMP method, and the Cu plating film, the seed layer, and the barrier metal film are left only inside the connection hole CT2 and the wiring groove LT2. Accordingly, the second-layer wiring M2 can be formed. It should be noted that the metal mainly made of Cu may be formed not only by an electroplating method but also a CVD method, a sputtering method, or a spatter reflow method.

A multilayer wiring is further formed on the second-layer wiring M2. FIG. 1 exemplifies the semiconductor device in which third-layer to sixth-layer wirings M3, M4, M5, and M6 are formed. Further, a passivation film PF is formed on the sixth-layer wiring M6 for preventing intrusion of moisture and impurities from the outside and for suppressing transmission of a rays.

<Characteristics and Effects of Metal Wiring According to Embodiment>

Characteristics and effects of metal wirings according to the embodiment will be described using FIGS. 2A, 2B, and 2C. FIG. 2A is a plan view for showing designed metal wirings and a designed contact plug according to the embodiment. FIG. 2B is a plan view for showing the upper surfaces of finished metal wirings and the upper surface of a finished contact plug according to the embodiment. FIG. 2C is a cross-sectional view taken along the line A-A' of FIG. 2B.

Figure 2A:
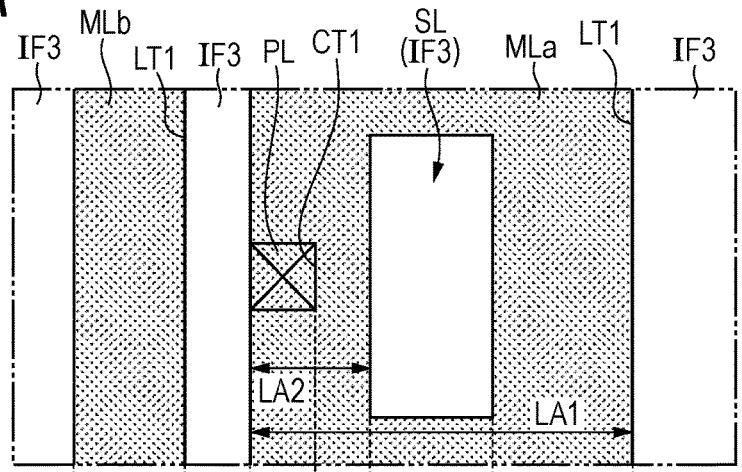
FIG. 2A is a plan view for showing designed metal wirings and a designed contact plug according to the embodiment.
Figure 2B:
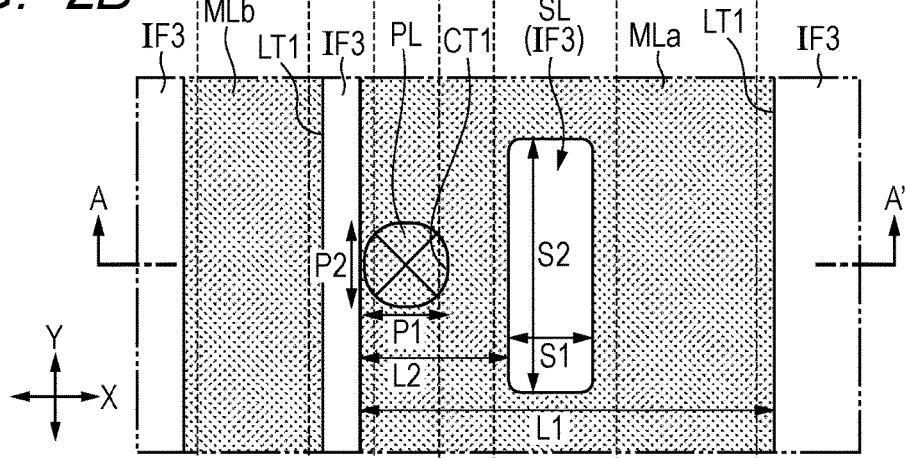
FIG. 2B is a plan view for showing the upper surfaces of finished metal wirings and the upper surface of a finished contact plug according to the embodiment.
Figure 2C:
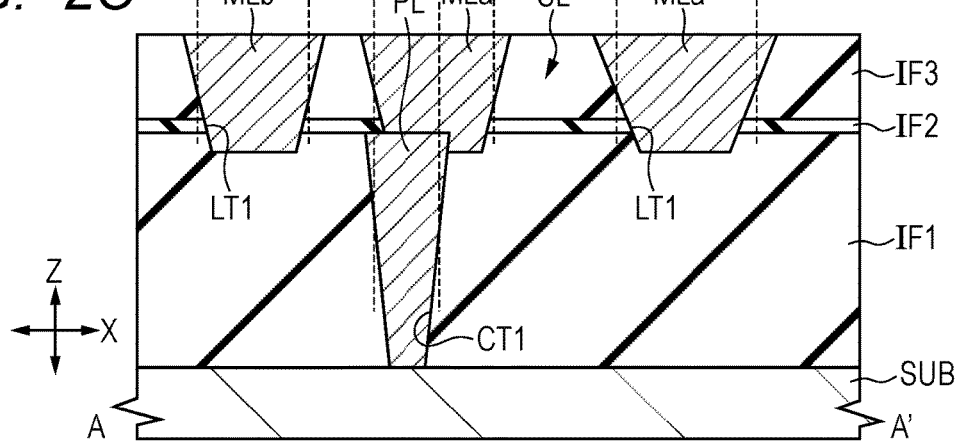
FIG. 2C is a cross-sectional view taken along the line A-A' of FIG. 2B.

Metal wirings MLa and MLb described using FIGS. 2A, 2B, and 2C are wirings that are formed by a single damascene method and are electrically coupled to a contact plug PL located in the lower layer, and correspond to the first-layer wirings M1 in the semiconductor device shown in, for example, FIG. 1.

As similar to the comparative example, when the metal wirings MLa and MLb and the contact plug PL are actually formed, the designed shapes and the finished shapes may be different from each other. For example, the designed shape of the contact plug PL in a planar view is a quadrangle. However, when the contact plug PL is actually formed, the finished shape of the contact plug PL in a planar view becomes a circular shape because the corners of the connection hole CT1 into which the contact plug PL is embedded are rounded due to the rounding phenomenon. Further, for example, it is difficult to vertically process the wiring groove LT1 into which the metal wirings MLa and MLb are embedded and the connection hole CT1 into which the contact plug PL is embedded. When the wiring groove LT1 and the connection hole CT1 are actually formed, the side walls thereof are inclined.

Accordingly, FIG. 2A shows the designed metal wirings MLa and MLb and the designed contact plug PL in a planar view, FIG. 2B shows the upper surfaces of the finished metal wirings MLa and MLb and the finished contact plug PL in a planar view, and FIG. 2C shows the finished metal wirings MLa and MLb and the finished contact plug PL in a cross-sectional view.

It should be noted that the side positions of the designed metal wirings MLa and MLb in a planar view substantially coincide with the side intermediate positions of the finished metal wirings MLa and MLb in the Z direction (the direction vertical to the upper surfaces of the metal wirings MLa and MLb) in a cross-sectional view. Thus, the metal wirings MLa and MLb shown in FIG. 2A can be regarded as a view obtained by planarly cutting the metal wirings MLa and MLb shown in FIG. 2C at the intermediate positions in the Z direction. Likewise, the side position of the designed contact plug PL in a planar view substantially coincides with the side intermediate position of the finished contact plug PL in the Z direction (the direction vertical to the upper surface of the contact plug PL) in a cross-sectional view. Thus, the contact plug PL shown in FIG. 2A can be regarded as a view obtained by planarly cutting the contact plug PL shown in FIG. 2C at the intermediate position in the Z direction.

Further, each dimension means a designed dimension and a finished dimension. However, each dimension refers to a finished dimension, unless otherwise specified.

As shown in FIGS. 2A, 2B, and 2C, the interlayer insulating film IF1 is formed so as to cover a semiconductor element (not shown) formed on the main surface of the semiconductor substrate SUB, and the contact plug PL electrically coupled to the semiconductor element and the like is formed while penetrating from the upper surface to the lower surface of the interlayer insulating film IF1. The contact plug PL is configured using a conductive film that is embedded inside the connection hole CT1 formed in the interlayer insulating film IF1 and is mainly made of, for example, W.

Further, the stopper insulating film IF2 and the insulating film IF3 on which wirings are formed are sequentially formed on the interlayer insulating film IF1.

The stopper insulating film IF2 is a material having a function as a protective film for preventing diffusion of Cu, and can be, for example, an SiN film, an SiC film, an SiCN film, an SiOC film, or an SiOCH film. Alternatively, the stopper insulating film IF2 can be, for example, an SiN film containing organic substances, an SiC film containing organic substances, an SiCN film containing organic substances, an SiOC film containing organic substances, an SiOCH film containing organic substances, a film mainly made of organic substances, or a film mainly made of organic substances containing SiO.

The insulating film IF3 is a material having a function of insulating and separating the metal wirings MLa and MLb, and may be a film containing holes therein to reduce the capacity between the wirings. The insulating film IF3 can be, for example, an $SiO_2$ film, an SiOCH film, or an SiOC film. Alternatively, the insulating film IF3 can be, for example, an $SiO_2$ film containing organic substances, an SiOCH film containing organic substances, an SiOC film containing organic substances, an HSQ (Hydrogen Silsesqioxane) film, an MSQ (Methyl Silsesquioxane) film, an organic polymer film, or a molecular pore film using a cyclic organic silica raw material.

The metal wirings MLa and MLb electrically coupled to the contact plug PL are formed by a damascene process while penetrating from the upper surface of the insulating film IF3 to the lower surface of the stopper insulating film IF2. The metal wirings MLa and MLb are configured using a conductive film that is embedded inside the wiring groove LT1 formed in the stopper insulating film IF2 and the insulating film IF3 and is mainly made of, for example, Cu.

The metal wiring MLa and the metal wiring MLb are adjacent to each other in the X direction (the wiring width direction or a first direction) across the separation part formed of the laminated film of the stopper insulating film IF2 and the insulating film IF3. The finished width of the upper surface of the separation part in the X direction is smaller than that of the upper surface of each of the metal wirings MLa and MLb in the X direction, is equal to or smaller than the finished dimension (a first plug diameter P1 to be described later) of the upper surface of the contact plug PL in the X direction, and is, for example, 70 nm or smaller.

Further, the metal wirings MLa and MLb extend in the Y direction (the wiring length direction or a second direction) orthogonal to the X direction, and the thickness of each of the metal wirings MLa and MLb is, for example, about 90 nm to 140 nm.

The metal wiring MLa according to the embodiment is electrically coupled to the contact plug PL located in the lower layer, and the contact plug PL is located at one end of the metal wiring MLa in the X direction in a planar view.

As shown in FIG. 2B, the finished dimension of the upper surface of the contact plug PL in the X direction is assumed as the first plug diameter (a first diameter) 21, and the finished dimension of the upper surface of the contact plug PL in the Y direction is assumed as a second plug diameter (a second diameter) P2. Here, the first plug diameter P1 is defined as the longest distance between two parallel lines in contact with both sides of the upper surface of the contact plug PL in the X direction. Further, the second plug diameter P2 is defined as the longest distance between two parallel lines in contact with both sides of the upper surface of the contact plug PL in the X direction. The first plug diameter P1 is, for example, 70 nm or smaller.

In FIG. 2B, the first plug diameter 21 and the second plug diameter P2 of the contact plug PL are the same. However, the first plug diameter 21 and the second plug diameter P2 of the contact plug PL may be different from each other. Further, the finished wiring width L1 between one end and the other end of the upper surface of the metal wiring MLa in the X direction is 2.5 times or larger than the first plug diameter P1, and is, for example, 175 nm or larger.

Further, a slit SL is formed in the metal wiring MLa according to the embodiment. The slit SL is a region surrounded by the metal wiring MLa in a planar view, and is a region where the stopper insulating film IF2 and the insulating film IF3 are left. Further, the slit SL is formed at a position apart in the X direction from the end of the metal wiring MLa on the side where the contact plug PL is arranged. It should be noted that the slit SL is desirably formed at a position that is not overlapped with the contact plug PL.

As shown in FIG. 2B, a finished distance L2 between an edge of the upper surface at the end of the metal wiring MLa on the side where the contact plug PL is arranged and the upper surface of the slit SL in the X direction is equal to or larger than and twice or smaller than the first plug diameter 21, and is, for example, 70 μm or larger and 140 nm or smaller.

The finished dimension (slit width) of the upper surface of the slit SL in the X direction is assumed as a first slit dimension S1, and the finished dimension (slit length) of the upper surface of the slit SL in the Y direction is assumed as a second slit dimension S2. The first slit dimension S1 is equal to or larger than the first plug diameter P1. Further, the second slit dimension S2 is 2.5 times or larger than the second plug diameter P2, and is, for example, 175 nm or larger.

As described above, the slit SL is formed at a position apart in the X direction from the end of the metal wiring MLa on the side where the contact plug PL is arranged, and thus a region with a small wiring width is provided in a part of the metal wiring MLa. As shown in FIG. 2A, the region with a small wiring width between one end of the metal wiring MLa and the slit SL in the X direction can be assumed as a designed pseudo wiring width (hereinafter, referred to as a pseudo wiring width) LA2, and the pseudo wiring width LA2 is naturally smaller than a designed wiring width LA1 between one end and the other end of the metal wiring MLa in the X direction.

As the designed wiring width LA1 of the metal wiring MLa increases, the finished taper angle of the side wall of the wiring groove LT1 along the Y direction in which the metal wiring MLa is formed tends to increase. However, the region with a small wiring width having the pseudo wiring width LA2 is formed by forming the slit SL, and thus the finished taper angle of the side wall of the wiring groove LT1 can be reduced in the region. Namely, the finished taper angle of the side surface of the metal wiring MLa along the Y direction in the region with a small wiring width (the region where the slit SL is formed) having the pseudo wiring width LA2 becomes smaller than the finished taper angle of the side surface of the metal wiring MLa along the Y direction in the region with a large wiring width having the designed wiring width LA1.

Further, as the separation part between the metal wiring MLa and the metal wiring MLb adjacent to each other in the X direction comes close to an isolated pattern, the lithography depth of focus decreases, and the finished dimension of the width of the separation part in the X direction tends to be larger than the designed dimension. However, the slit SL serves as the separation part by forming the slit SL, and the isolated pattern can be eliminated. Thus, a decrease in the lithography depth of focus can be avoided, and the finished dimension of the width of the separation part in the X direction can be equal to or closer to the designed dimension thereof.

Therefore, even in the case of the metal wiring MLa having a large wiring width and the separation part with a small width adjacent in the X direction, the slit SL is formed, and the finished taper angle of the side surface of the metal wiring MLa along the Y direction in the region with a small wiring width having the pseudo wiring width LA2 becomes smaller. Further, the finished dimension of the width of the separation part in the X direction becomes equal to or closer to the designed dimension thereof.

As shown in FIG. 2C, the finished side surfaces of the metal wiring MLa along the Y direction are inclined so that the wiring width of the metal wiring MLa in the X direction is reduced from the upper surface to the lower surface of the metal wiring MLa. However, more than half of the upper surface of the contact plug PL can come into contact with the metal wiring MLa because the slit SL is formed, the finished taper angle of the side surface of the metal wiring MLa along the Y direction in the region with a small wiring width having the pseudo wiring width LA2 becomes smaller, and further the finished dimension of the width of the separation part in the X direction becomes equal to or closer to the designed dimension thereof.

Further, when forming the wiring groove LT1 in the stopper insulating film IF2 and the insulating film IF3, the depth (recess amount) of a recess formed in the interlayer insulating film IF1 is adjusted so that the upper surface of the contact plug PL is located closer to the upper surface side of the metal wiring MLa than the position of the lower surface of the metal wiring MLa. Accordingly, even a part of the side surface of the contact plug PL can come into contact with the metal wiring MLa.

As described above, even in the case of the metal wiring MLa having a large wiring width and the separation part with a small width adjacent in the X direction, the slit SL is formed in a part of the metal wiring MLa to arrange the contact plug PL in the region with a small wiring width having the pseudo wiring width LA2. Thus, the contact area between the metal wiring MLa and the contact plug PL can be secured. Accordingly, the contact resistance between the metal wiring MLa and the contact plug PL can be reduced, and the operating characteristics of the semiconductor device can be improved.

It should be noted that the designed shape of the slit SL in a planar view is desirably a quadrangle (rectangle), but is not particularly limited thereto.

(First Modified Example)

Figure 3A:
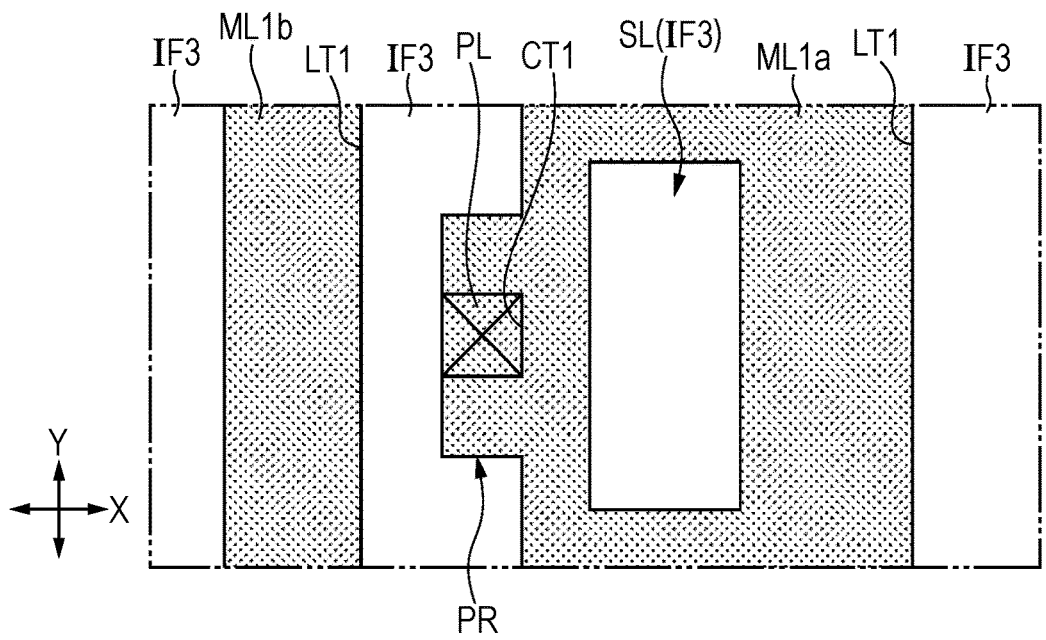
FIG. 3A is a plan view for showing designed metal wirings and a designed contact plug according to a first modified example of the embodiment.
Figure 3B:
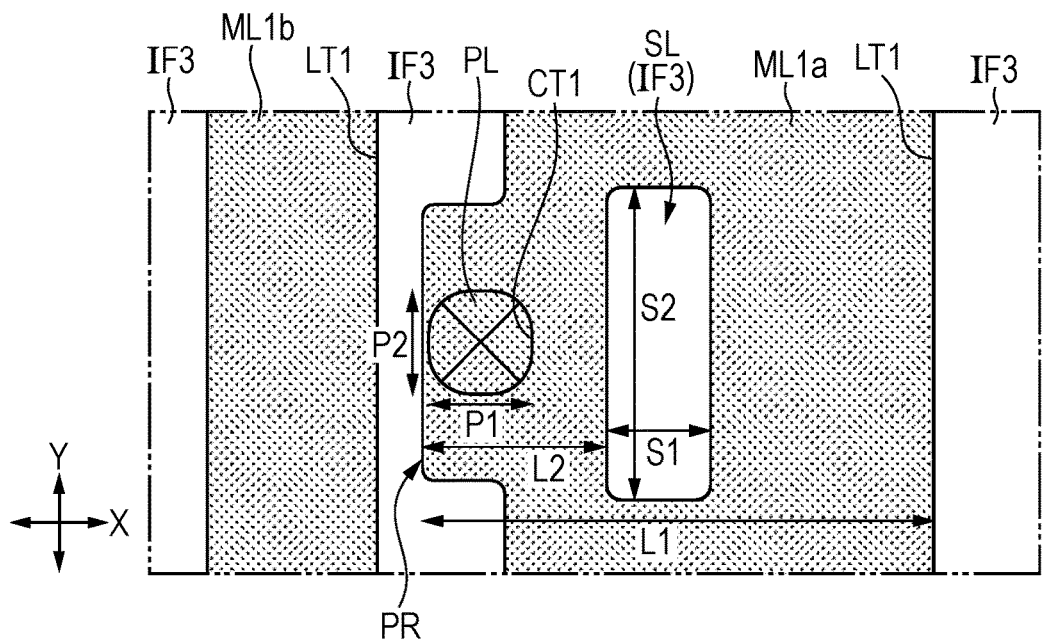
FIG. 3B is a plan view for showing the upper surfaces of finished metal wirings and the upper surface of a finished contact plug according to the first modified example of the embodiment.

Metal wirings according to a first modified example of the embodiment will be described using FIGS. 3A and 3B. FIG. 3A is a plan view for showing designed metal wirings and a designed contact plug according to the first modified example of the embodiment. FIG. 3B is a plan view for showing the upper surfaces of finished metal wirings and the upper surface of a finished contact plug according to the first modified example of the embodiment.

The metal wiring MLa according to the above-described embodiment and a metal wiring ML1a according to the first modified example have different wiring shapes. However, since the other configurations are almost the same, different points will be described.

As shown in FIGS. 3A and 3B, the metal wiring ML1a according to the first modified example has a projection part (convex part) PR projecting in the X direction at one end along the Y direction facing a metal wiring ML1b in a planar view, and a contact plug PL located in the lower layer is electrically coupled to one end of the metal wiring ML1a in the X direction in the projection part PR. The finished length of the upper surface of the projection part PR in the X direction is, for example, equal to or smaller than the finished dimension (first plug diameter P1) of the upper surface of the contact plug PL in the X direction. Further, the metal wiring ML1a is adjacent to the metal wiring ML1b in the X direction while sandwiching a separation part. The finished width of the upper surface of the separation part between the projection part PR and the metal wiring ML1b is equal to or smaller than the finished dimension (first plug diameter P1) of the upper surface of the contact plug PL in the X direction, and is, for example, 70 nm or smaller.

In the projection part PR, the finished taper angle of the side surface of the metal wiring ML1a along the Y direction is increased (problem 1), and the finished width of the separation part adjacent to the metal wiring ML1a in the X direction is increased (problem 2). In addition, there is a problem that the etching retraction amount of a resist pattern at the time of forming the metal wiring ML1a is likely to be increased, and further, the corners are easily scraped due to the influence of rounding. Therefore, it is conceivable that the contact area between the metal wiring ML1a and the contact plug PL is more decreased than that in the case of the metal wiring MLa without the above-described projection part PR.

However, even in the metal wiring ML1a having the projection part PR, a slit SL is formed at a position apart from the end of the projection part PR of the metal wiring ML1a in the X direction. A pseudo region with a small wiring width can be provided by forming the slit SL. It should be noted that the slit SL is desirably formed at a position that is not overlapped with the contact plug PL in a planar view.

As shown in FIG. 3B, a finished distance L2 between an edge of the upper surface at the end of the projection part PR of the metal wiring ML1a and the upper surface of the slit SL in the X direction is equal to or larger than and twice or smaller than the first plug diameter P1, and is, for example, 70 μm or larger and 140 nm or smaller.

The finished dimension (slit width) of the upper surface of the slit SL in the X direction is assumed as a first slit dimension S1, and the finished dimension (slit length) of the upper surface of the slit SL in the Y direction is assumed as a second slit dimension S2. The first slit dimension S1 is equal to or larger than the first plug diameter P1. Further, the second slit dimension S2 is 2.5 times or larger than the second plug diameter P2, and is, for example, 175 nm or larger.

As described above, even in the case of the metal wiring ML1a having a large wiring width, the separation part with a small width adjacent in the X direction, and the projection part PR, the slit SL is formed, and the finished taper angle of the side surface of the metal wiring ML1a along the Y direction becomes smaller in the pseudo region with a small wiring width. Further, the finished dimension of the width of the separation part in the X direction becomes equal to or closer to the designed dimension thereof. Therefore, even if the etching retraction amount of a resist pattern at the time of forming the metal wiring ML1a is increased in the projection part PR, and further, the corners are scraped due to the influence of rounding, the contact area between the metal wiring ML1a and the contact plug PL can be secured. Accordingly, the contact resistance between the metal wiring ML1a and the contact plug PL can be reduced.

(Second Modified Example)

Figure 4A:
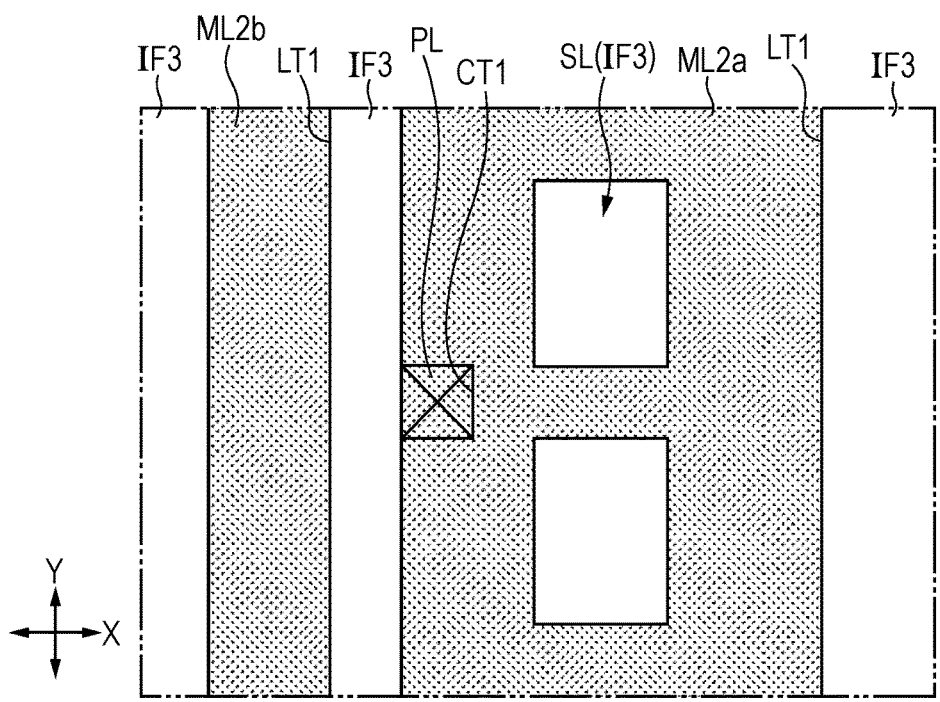
FIG. 4A is a plan view for showing designed metal wirings and a designed contact plug according to a second modified example of the embodiment.
Figure 4B:
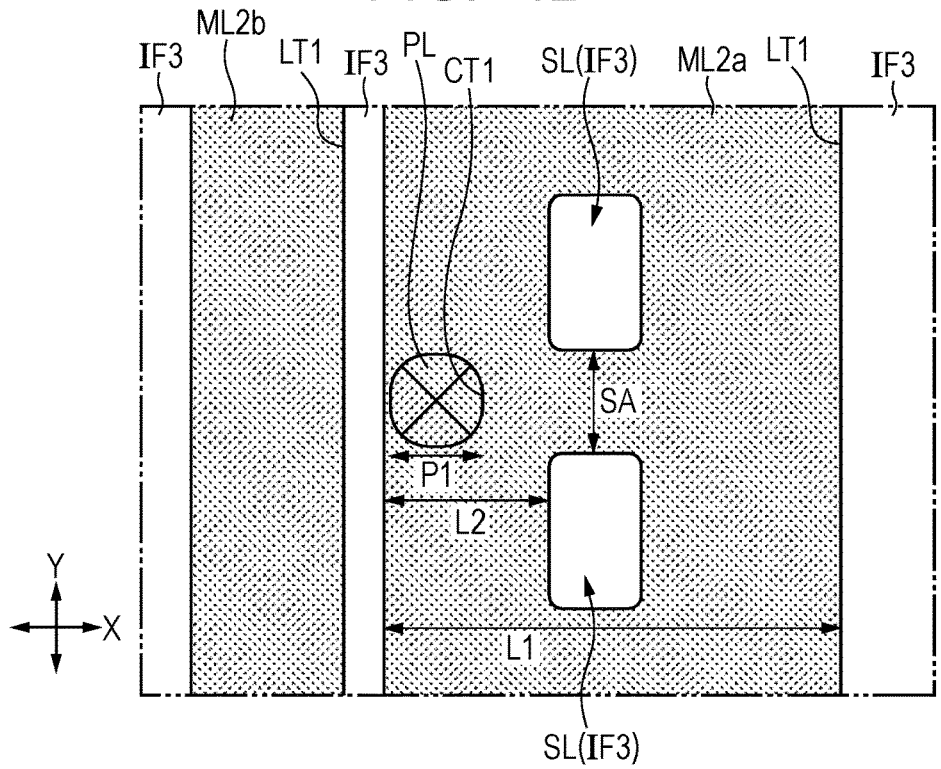
FIG. 4B is a plan view for showing the upper surfaces of finished metal wirings and the upper surface of a finished contact plug according to the second modified example of the embodiment.

Metal wirings according to a second modified example of the embodiment will be described using FIGS. 4A and 4B. FIG. 4A is a plan view for showing designed metal wirings and a designed contact plug according to the second modified example of the embodiment. FIG. 4B is a plan view for showing the upper surfaces of finished metal wirings and the upper surface of a finished contact plug according to the second modified example of the embodiment.

The metal wiring MLa according to the above-described embodiment and a metal wiring ML2a according to the second modified example have different slit arrangements. However, since the other configurations are almost the same, different points will be described.

As shown in FIGS. 4A and 4B, a plurality of slits SL is formed at a predetermined interval along the Y direction in the metal wiring ML2a according to the second modified example. Although a contact plug PL located in the lower layer is electrically coupled to one end of the metal wiring ML2a in the X direction in a planar view, a portion where the interval between the slits SL adjacent in the Y direction is formed is located on the extended line of the contact plug PL in the X direction. Accordingly, the contact plug PL and the slits SL can be prevented from overlapping with each other in a planar view. Further, the metal wiring ML2a is adjacent to a metal wiring ML2b in the X direction while sandwiching a separation part. The finished width of the upper surface of the separation part in the X direction is equal to or smaller than the finished dimension (first plug diameter P1) of the upper surface of the contact plug PL in the X direction, and is, for example, 70 nm or smaller.

As shown in FIG. 4B, a finished interval SA between the upper surfaces of the slits SL that are adjacent to each other in the Y direction is equal to or larger than and twice or smaller than the first plug diameter P1. Further, a finished distance L2 between an edge of the upper surface at the end of the metal wiring ML2a on the side where the contact plug PL is arranged and the upper surface of each slit SL in the X direction is equal to or larger than and twice or smaller than the first plug diameter P1, and is, for example, 70 μm or larger and 140 nm or smaller.

When the finished dimension (slit width) of the upper surface of each slit SL in the X direction is assumed as a first slit dimension S1, the first slit dimension S1 is equal to or larger than the first plug diameter P1.

As described above, even if the slits SL are formed in the metal wiring ML2a having a large wiring width and the separation part with a small width adjacent in the X direction, the finished taper angle of the side surface of the metal wiring ML2a along the Y direction becomes smaller, and further, the finished dimension of the width of the separation part in the X direction becomes equal to or closer to the designed dimension thereof. In addition, since the contact plug PL and the slits SL can be prevented from overlapping with each other in a planar view, a decrease in the contact resistance between the metal wiring ML2a and the contact plug PL caused by the slits SL can be prevented.

The invention made by the inventors has been concretely described above on the basis of the embodiment. However, it is obvious that the present invention is not limited to the above-described embodiment, and can be variously changed without departing from the gist thereof.

What is claimed is:

1. A semiconductor device comprising:
   a contact plug that is formed over a semiconductor substrate;
   a first wiring that is coupled to the upper surface of the contact plug; and
   a slit that is formed in the first wiring,
   wherein the contact plug is formed at an end of the first wiring and the slit is formed at a position apart from the contact plug in a first direction in a top view,
   wherein a distance between an edge of the end of the first wiring and an edge of the slit on the contact plug side in the first direction is greater or equal to a first diameter of the upper surface of the contact plug in the first direction in a top view and less or equal to twice the first diameter, and
   wherein there are no wirings in the slit.

2. The semiconductor device according to claim 1,
   wherein the side surfaces of the first wiring are inclined in such a manner that the width of the first wiring in the first direction is reduced from the upper surface of the first wiring to the lower surface of the first wiring, and
   wherein more than half of the upper surface of the contact plug comes into contact with the first wiring.

3. The semiconductor device according to claim 2,
   wherein the lower surface of the first wiring is formed up to a position lower than the upper surface of the contact plug, and
   wherein a part of each side surface of the contact plug comes into contact with the first wiring.

4. The semiconductor device according to claim 1,
   wherein the length of the slit in a second direction orthogonal to the first direction in a top view is at least 2.5 times larger than a second diameter of the upper surface of the contact plug in the second direction in a top view.

5. The semiconductor device according to claim 1,
   wherein the side surfaces of the first wiring are inclined in such a manner that the width of the first wiring in the first direction is reduced from the upper surface of the first wiring to the lower surface of the first wiring,
   wherein more than half of the upper surface of the contact plug comes into contact with the first wiring,
   wherein the length of the slit in a second direction orthogonal to the first direction in a top view is at least 2.5 times larger than a second diameter of the upper surface of the contact plug in the second direction in a top view, wherein the side surface of the first wiring has a first region where the slit is formed in the first direction and a second region where the slit is not formed in the first direction, and wherein the inclination of the side surface of the first wiring in the first region is smaller than that of the side surface of the first wiring in the second region.

6. The semiconductor device according to claim 1, wherein the width of the upper surface of the first wiring in the first direction is at least 2.5 times larger than the first diameter.

7. The semiconductor device according to claim 1, wherein the first diameter is 70 nm or smaller.

8. The semiconductor device according to claim 1, wherein the width of the slit in the first direction is equal to or larger than the first diameter in a top view.

9. The semiconductor device according to claim 1, wherein the first wiring has a projection part projecting from the end of the first wiring in the first direction, and wherein the contact plug is coupled to the first wiring in the projection part.

10. The semiconductor device according to claim 9, wherein the length of the upper surface of the projection part in the first direction is equal to or smaller than the first diameter.

11. The semiconductor device according to claim 1, further comprising:
   a first insulating film that is formed over the semiconductor substrate;
   a contact hole that is formed in the first insulating film and reaches the semiconductor substrate;
   a second insulating film that is formed over the first insulating film; and
   a wiring groove that is formed in the second insulating film,
   wherein the contact plug is formed by embedding a first conductive film into the contact hole,
   wherein the first wiring is formed by embedding a second conductive film into the wiring groove, and
   wherein the slit is a region where the second insulating film remains, and is a region surrounded by the second conductive film in a planar view.

12. The semiconductor device according to claim 11, wherein the first conductive film contains tungsten, and wherein the second conductive film contains copper.

13. The semiconductor device according to claim 1, wherein a second wiring that is provided while facing the end of the first wiring through a separation part in the first direction and is formed in the same layer as the first wiring is further provided, and wherein the width of the upper surface of the second wiring is smaller than that of the upper surface of the first wiring, and is larger than a distance between the upper surface of the first wiring and the upper surface of the second wiring in the first direction.

14. The semiconductor device according to claim 1, wherein a second wiring that is provided while facing the end of the first wiring through a separation part in the first direction and is formed in the same layer as the first wiring is further provided, and wherein a distance between the upper surface of the first wiring and the upper surface of the second wiring in the first direction is 70 nm or smaller.

15. The semiconductor device according to claim 1, wherein a plurality of slits is formed at a first interval along a second direction orthogonal to the first direction in a planar view, and a portion where the first interval is formed is located on the extended line of the contact plug in the first direction.

16. The semiconductor device according to claim 15, wherein a distance between adjacent slits in the second direction in a top view is greater or equal to a second diameter of the upper surface of the contact plug in the second direction and less or equal to twice the second diameter.

* * * * *